United States Patent
Pang et al.

(10) Patent No.: US 8,242,361 B2
(45) Date of Patent: Aug. 14, 2012

(54) TUNER HOUSING

(75) Inventors: Kim Suan Pang, Singapore (SG); Lye Yoong Lum, Singapore (SG); Kok Keen Leong, Singapore (SG)

(73) Assignee: Thomson Licensing, Boulogne-Billancourt (FR)

( * ) Notice: Subject to any disclaimer, the term of this patent is extended or adjusted under 35 U.S.C. 154(b) by 276 days.

(21) Appl. No.: 12/734,592

(22) PCT Filed: Oct. 28, 2008

(86) PCT No.: PCT/EP2008/064573
§ 371 (c)(1),
(2), (4) Date: May 11, 2010

(87) PCT Pub. No.: WO2009/062842
PCT Pub. Date: May 22, 2009

(65) Prior Publication Data
US 2010/0270068 A1  Oct. 28, 2010

(30) Foreign Application Priority Data

Nov. 12, 2007  (EP) .................................. 07301543

(51) Int. Cl.
*H05K 5/02*   (2006.01)
*H01L 23/48*  (2006.01)
(52) U.S. Cl. .......................... 174/51; 174/549; 174/561

(58) Field of Classification Search .................... 174/51, 174/520, 382, 384, 549, 561
See application file for complete search history.

(56) References Cited

U.S. PATENT DOCUMENTS

| 3,816,911 | A  | * | 6/1974  | Knappenberger ............... 29/841  |
| 4,628,412 | A  | * | 12/1986 | Nigorikawa .................. 361/816  |
| 4,747,019 | A  | * | 5/1988  | Ito et al. ......................... 361/816 |
| 4,754,101 | A  | * | 6/1988  | Stickney et al. ............... 174/383 |
| 4,816,613 | A  | * | 3/1989  | Ito et al. ......................... 174/372 |
| 4,948,923 | A  |   | 8/1990  | Suzuki                                |
| 5,608,188 | A  | * | 3/1997  | Choon et al. .................. 174/372 |
| 5,704,117 | A  | * | 1/1998  | Mok et al. ........................ 29/841 |
| 6,144,557 | A  | * | 11/2000 | Chen et al. .................... 361/704 |
| 6,339,535 | B1 | * | 1/2002  | Gahl ............................... 361/801 |
| 6,593,523 | B2 | * | 7/2003  | Okada et al. .................. 174/377 |
| 6,930,891 | B1 | * | 8/2005  | Hama et al. ................... 361/800 |

FOREIGN PATENT DOCUMENTS

| DE | 3233621    | 1/1984  |
| DE | 3629913    | 3/1988  |
| DE | 3922461    | 1/1990  |
| EP | 1381264    | 1/2004  |
| JP | 02078296   | 3/1990  |
| WO | WO9746064  | 12/1997 |

* cited by examiner

*Primary Examiner* — Hung Ngo
(74) *Attorney, Agent, or Firm* — Tutunjian & Bitetto, P.C.

(57) ABSTRACT

A tuner housing according to the invention comprises a support for carrying electronic equipment and at least one cover part which is attached to the support. The support comprises at least one ground lug which extends through a hole of the cover part. The cover part is provided with a projection which projects into the hole and contacts the ground lug.

9 Claims, 2 Drawing Sheets

TUNER HOUSING

This application claims the benefit, under 35 U.S.C. §365 of International Application PCT/EP2008/064573, filed Oct. 28, 2008, which was published in accordance with PCT Article 21(2) on May 22, 2009 in English and which claims the benefit of European patent application No. 07301543.0, filed Nov. 12, 2007.

BACKGROUND OF THE INVENTION

1. Field of the Invention

The present invention relates to a tuner housing. Respective tuner housings are used for high or radio frequency (HF, RF) tuners such as TV tuners, WiFi receivers and GPS receivers. An RF tuner requires a special housing, namely a metal enclosure for shielding external high frequency interferences.

2. Description of the Prior Art

A shielding device for electronic equipment used for high frequencies is described in the JP 02078296. The device comprises a support mentioned as a case carrying the electronic equipment and a cover part mentioned as a cover. The cover is provided with a clamping element mentioned as a plate spring like contact piece. When the cover is mounted this plate spring is brought into contact with a side wall of the case. The plate spring realizes a high frequency connection and an electronic shielding, wherein the high frequency potential of the case is made equal to that of the cover. The plate spring is fitted to the cover by pasting.

SUMMARY OF THE INVENTION

It is desirable to assure and to improve the electromagnetic shielding, namely the RF (radio frequency) immunity and the electromagnetic performance, of a tuner housing, where a support of the tuner housing comprises ground lugs. The lugs are installed for connecting the support to a main board for grounding and they extend through holes of a cover part of the tuner housing.

A tuner housing according to the invention comprises a support for carrying electronic equipment and at least one cover part which is attached to the support. The support comprises at least one ground lug which extends through a corresponding hole of the cover part. The ground lugs are installed for connecting the support to e.g. a main board for grounding. Gaps are needed between the support, i.e. the ground lug, and the cover part at the ground lugs region to cater for mechanical engineering tolerance. The gaps insure that the cover part can be easily fitted to the support during manufacturing. These gaps often compromise RF immunity and EMC performance. E.g. in a horizontal mount tuner, these gaps can cause significant deterioration to performance. When enhanced shielding performance is required, these gaps can be manually sealed with solder during manufacturing. However this results in added manufacturing cost as extra manpower is needed for the manual soldering as well as an increase in solder consumption. Moreover, there is no consistency in these manual solder joints and their appearance is not pleasing.

According to the invention the cover part is provided with a projection for each ground lug which projects into the hole and contacts the ground lug. This projection provides enhanced RF shielding as well as an improved electrical ground contact between the support and the cover part. The RF immunity and EMC performance is enhanced. Manufacturing costs are lower and the appearance better compared to manual solder joints. It is possible to reuse the cover part which is not possible when using manual solder joints.

Preferably, the attachment of the cover part to the support is generated as a clamped connection with a certain clamping force in a direction perpendicular to the elongation of the ground lugs wherein each projection contacts the corresponding ground lug opposite to the clamping force. The clamping force assures the electrical ground contact between the support and the cover part. The contact of the projections to the ground lugs opposite to the clamping force further improves the electrical ground contact between the support and the cover and constitutes a better shielding.

In an embodiment of the invention the cover part comprises a cover wall covering the support with the electronic equipment and at least two clamping elements at opposite sides of the cover wall. The clamping elements are bent off from the cover wall in a direction to corresponding side walls of the support. They are in a resilient contact with the side walls. Generating a clamped connection with at least two clamping elements of the cover part enables a simple structure of the cover part which is easily to manufacture. The clamping elements are bent to the side walls of the support in a way that they are in a resilient contact with the side walls which enables the clamping force and assures a safe electrical ground contact between the cover part and the support.

Preferably, each clamping element comprises an outward bent end part while side walls comprise at least one bulge for each clamping element. The outward bent end part of the clamping element is located next to the bulge opposite to the cover wall. As a result, each clamping element engages with at least one of the bulge of the corresponding side wall. This improves the contact of the cover part with the support in addition.

Preferably, each ground lug is arranged at a border of the cover wall in the region of a clamping element. The corresponding projection contacts the ground lug on its inner face opposite to the clamping element. As a result, the clamping force and a contact force due to projection are close to each other. Thereby the contact of the projection to the ground lug is improved and with that, as mentioned above, the electrical ground contact and the shielding.

In one embodiment of the invention each ground lug is generated as a protrusion of a side wall of the support. This enables a simple structure of the support and is easily to manufacture. It enables also that both clamping and contact forces are directed to the ground lug and that the contact is improved.

Preferably, the projection is generated as at least two triangular teeth. This is a simple structure of the projection and easy to manufacture.

Preferably, each tooth has the shape of a triangle. The angle of a top of this triangle is between 60 and 120°, preferably between 80 and 100°. The shape of the top of the teeth results in that the teeth scratch into the grounding lug. This ensures the electrical ground contact.

In an embodiment of the invention the support of the tuner housing is generated as a frame which carries the electronic equipment, e.g. on a printed circuit board. The cover parts of the tuner housing are generated as a top cover and a bottom cover which are attached to the frame. The frame comprises the ground lugs. The top cover comprises the holes through which the ground lugs extend and the corresponding projections. The structure of this tuner housing enables a metal enclosure for the electronic equipment with an improved shielding function combined with a simple structure which is easy to manufacture and easy to assemble.

BRIEF DESCRIPTION OF THE DRAWINGS

The invention will be explained in more detail using preferred embodiments, illustrated in the figures.

In the figures.

DETAILED DESCRIPTION OF THE INVENTION

Figure 1:
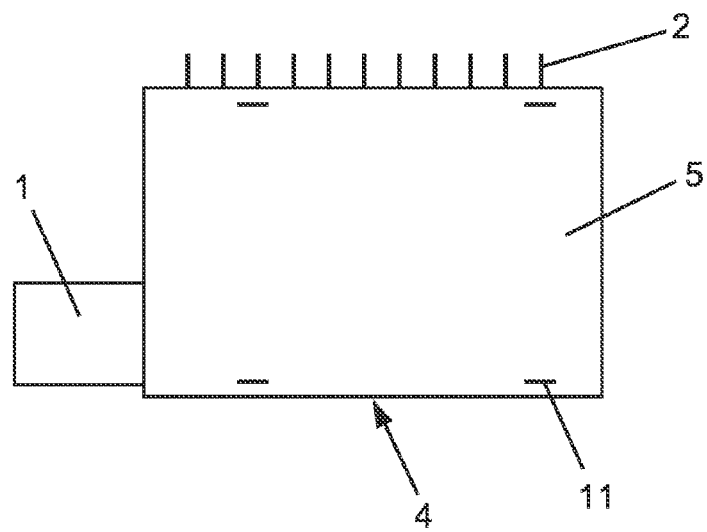
FIG. 1 shows a simplified top view of a tuner housing of a first embodiment according to the invention.
Figure 2:
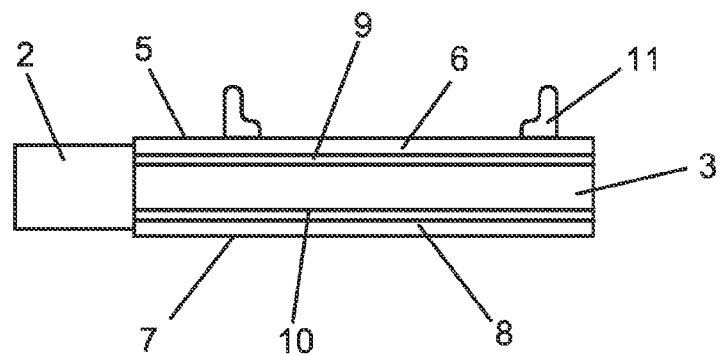
FIG. 2 shows a simplified side view of the tuner housing of FIG. 1.

A tuner housing according to the invention which is shown in the FIGS. 1 and 2 comprises a support, namely a frame, and two cover parts, namely a top cover and a bottom cover. The tuner housing further comprises a HF connector 1 and numerous connection pins 2. The top cover and the bottom cover are attached to the frame which comprises four side walls 3. The attachment of the top and bottom cover to the frame is generated as a clamped connection with a certain clamping force 4 in a direction perpendicular to the side walls 3.

The frame carries electronic equipment, in particular a printed circuit board with tuner circuitry. The electronic equipment is arranged inside of the tuner housing and is not visible in the figures.

The top cover comprises a cover wall, namely a top wall 5, covering the electronic equipment and at least two clamping elements 6 which are arranged at opposite sides of the top wall 5 and bent off from the top wall 5 in direction to the corresponding side walls 3 of the frame.

The bottom cover comprises a cover wall, namely a bottom wall 7, covering the back side of the printed circuit board and at least two clamping elements 8 which are arranged at opposite sides of the bottom wall 7 and bent off from the bottom wall 7 in direction to the corresponding side walls 3 of the frame.

Each clamping element 6, 8 comprises an outward bent end part 9, 10. Due to their shape the clamping elements 6, 8 are pressed to the side walls 3 generating the clamping force 4. They are in a resilient contact with the side walls 3.

In particular, the top cover comprises four clamping elements 6 which each extends over one of the four side walls 3. The bottom cover also comprises four clamping elements 8 of which each extends over one of the four side walls 4. The clamping elements 6, 8 contact the frame at an essential part of its circumference.

The frame also comprises four ground lugs 11, which are shown in the FIGS. 1 and 2.

Figure 3:
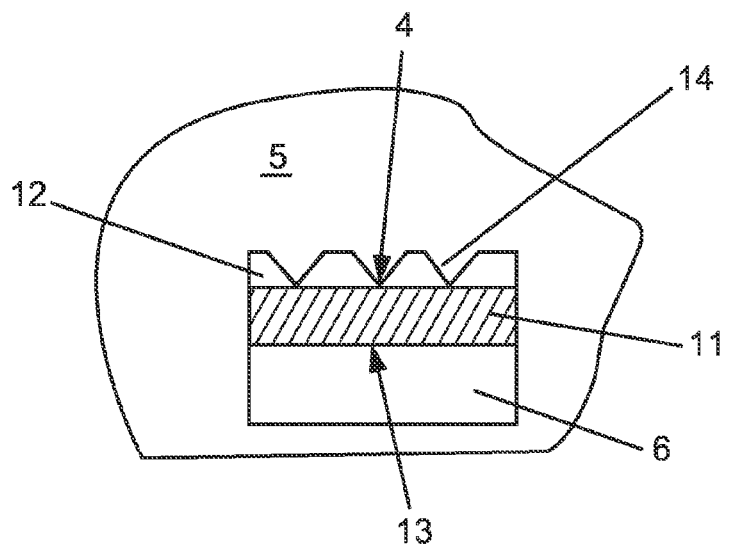
FIG. 3 shows a detail of FIG. 1, namely a ground lug extending through a hole of a top cover.
Figure 4:
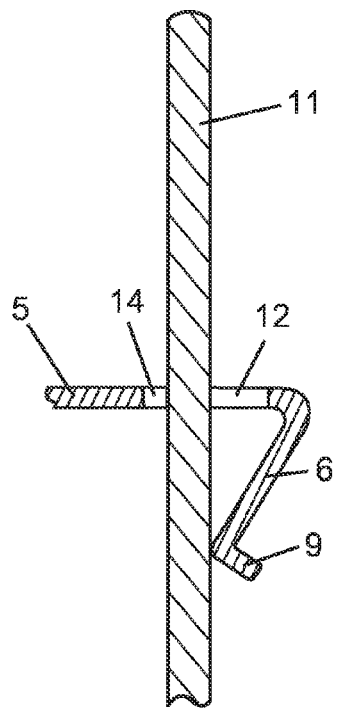
FIG. 4 shows a simplified cross section through the top cover at the ground lug.

FIGS. 3 and 4 show a region of a ground lug 11 in detail wherein FIG. 3 shows a top view and FIG. 4 a cross section.

Each ground lug 11 extends through a hole 12 of the top wall 5 of the top cover parallel to the side walls 3 of the frame.

As the clamping force of the clamped connection between the top cover and the frame acts in the direction perpendicular to the side walls it also acts in the direction perpendicular to the elongation of the ground lugs 11.

Each ground lug 11 has an inner section with a greater width in the region of the hole 12 and an outer section with a less width above this region. This is shown in FIG. 2.

The top wall 5 is provided with a projection for each ground lug 11 which projects into the hole 12 and contacts the ground lug 11. The projections are arranged in a way that each projection contacts the corresponding ground lug 9 opposite to the clamping force 3.

Each ground lug 11 is arranged at the border of the top wall 5 in the region of a clamping element 6. The corresponding projection contacts the ground lug 11 on its inner face with a contact force 13 opposite to the clamping element 6 and opposite to the clamping force 3.

The projection is generated in a preferred embodiment as three teeth 14. Each tooth 14 has the shape of a triangle, where the angle $\alpha$ of the top of the triangle is between 80 and 100°, e.g. 90°.

As an alternative the top cover and the bottom cover comprise numerous clamping elements 6, 8 distributed over the side walls 3 of the frame.

The tuner housing, namely the frame and the top and bottom cover are manufactured by a metal.

Figure 7:
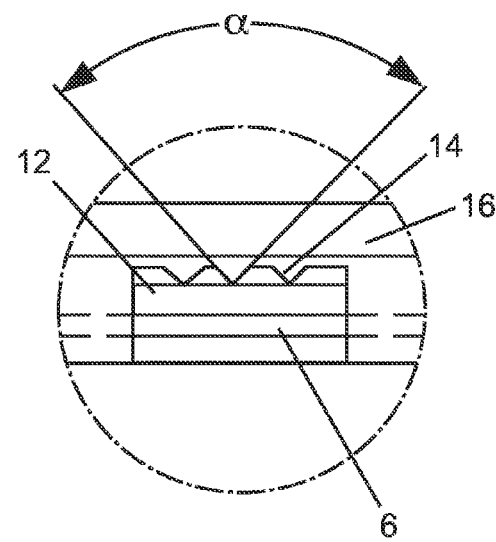
FIG. 7 shows a detail similar to FIG. 6, namely the top cover at the hole without ground lug.

The length of the tuner housing without HF connector 1 is e.g. about 50 mm, its width about 35 mm and its height about 10 mm. The length of each hole 12 is about 3.5 mm and its width about 2 mm. The width of the ground lug 11 which corresponds to the thickness of the side walls 3 is about 0.8 mm. The deepness of the teeth 14 is about 0.3 mm and represented in FIG. 7 by two lines projecting out of the detail circle. The thickness of the clamping element 6 which corresponds to the thickness of the top wall 5 is less or about 0.3 mm and is indicated in FIG. 7 by two parallel double lines crossing the hole 12. The clamping force is such that the teeth 14 are scratched into the ground lug 11, when attaching the top cover.

Figure 5:
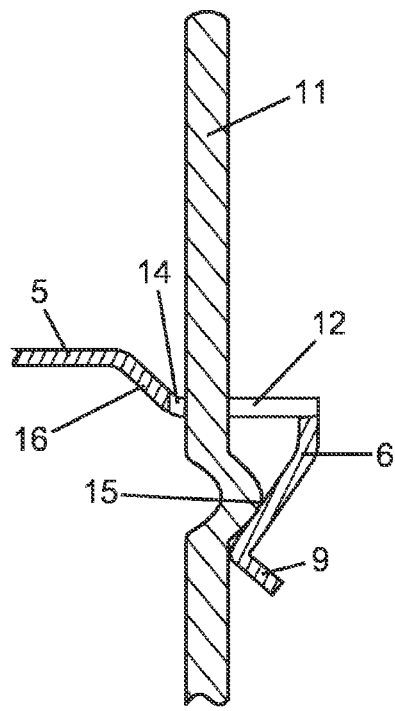
FIG. 5 shows a simplified cross section through a top cover with a ground lug of a second embodiment according to the invention.
Figure 6:
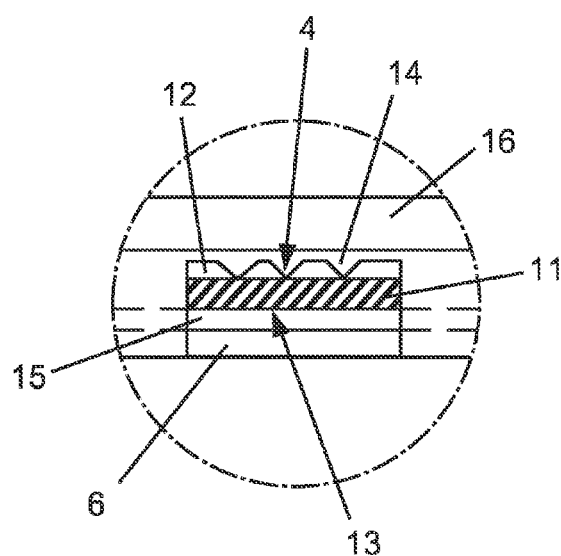
FIG. 6 shows a detail of a simplified top view of the second embodiment, namely a ground lug extending through a hole of a top cover.

A second embodiment according to the invention which is shown in the FIGS. 5 to 7 corresponds to the first embodiment except of the following features:

The side walls 3 comprise at least one bulge 15 for each clamping element 6, 8, wherein the end part 9, 10 is located next to the bulge 15 opposite to the top and the bottom wall 5, 7, respectively.

The top wall 5 is provided with a step 16 in direction to the side walls 3, wherein the holes 12 with the ground lugs 11 are arranged between the step 16 and the border of the top wall 5.

The invention claimed is:

1. A tuner housing comprising a support for carrying electronic equipment, and at least one cover part which is attached to the support, wherein the support comprises at least one ground lug which extends through a hole of the cover part and wherein the cover part is provided with a projection which projects into the hole and contacts the ground lug.

2. The tuner housing according to claim 1, wherein the attachment of the cover part to the support is generated as a clamped connection with a certain clamping force in a direction perpendicular to the elongation of the ground lugs and wherein each projection contacts the corresponding ground lug opposite to the clamping force.

3. The tuner housing according to claim 1, wherein the cover part comprises a cover wall and at least two clamping elements at opposite sides of the cover wall which are bent off from the cover wall in a direction to corresponding side walls of the support and which are in a resilient contact with the side walls.

4. The tuner housing according to claim 3, wherein each clamping element comprises an outward bent end part and the side walls comprise at least one bulge for each clamping element wherein the end part is located next to the bulge opposite to the cover wall.

5. The tuner housing according to claim 3, wherein each ground lug of the support is arranged at a border of the cover wall in the region of a clamping element and the corresponding projection contacts the ground lug on its inner face opposite to the clamping element.

6. The tuner housing according to claim 5, wherein each ground lug is generated as a protrusion of a side wall of the support.

7. The tuner housing according to claim 1, wherein the projection is generated as at least two triangular teeth.

8. The tuner housing according to claim 7, wherein each tooth has the shape of a triangle and the angle of a top of the triangle is between 60 and 120°, preferably between 80 and 100°.

9. The tuner housing according to claim 7, wherein the support is generated as a frame carrying the electronic equipment and wherein two cover parts are generated as a top cover and a bottom cover, which are clamp-connected to the frame, wherein the frame comprises the ground lugs and the top cover comprises the holes through which the ground lugs and the corresponding projections extend.

* * * * *